United States Patent [19]
Clark et al.

[11] Patent Number: 5,289,028
[45] Date of Patent: Feb. 22, 1994

[54] HIGH POWER SEMICONDUCTOR DEVICE WITH INTEGRAL ON-STATE VOLTAGE DETECTION STRUCTURE

[75] Inventors: Lowell Clark, Phoenix; Robert B. Davies; David F. Mietus, both of Tempe, all of Ariz.

[73] Assignee: Motorola, Inc., Schaumburg, Ill.

[21] Appl. No.: 787,166

[22] Filed: Nov. 4, 1991

[51] Int. Cl.⁵ .................. H01L 23/62; H01L 29/74; H01L 23/58; H01L 29/90
[52] U.S. Cl. .................................. 257/355; 257/603; 257/139; 257/487; 257/360
[58] Field of Search ............... 257/355, 139, 140, 173, 257/477, 487, 491, 360, 361, 603

[56] References Cited

U.S. PATENT DOCUMENTS 5,025,298  6/1991  Fay et al. ........................ 257/355
5,136,349  8/1992  Yilmaz et al. .................... 257/603
5,162,966  11/1992  Fujihira ........................... 257/360

Primary Examiner—Rolf Hille
Assistant Examiner—Wael Fahmy
Attorney, Agent, or Firm—Joe E. Barbee; Rennie William Dover

[57] ABSTRACT

A semiconductor device having a power switch (12) and a saturation detection diode (13) formed in an upper surface of a semiconductor drift region (11) is provided. The saturation detector diode (13) and the power switch (12) are electrically coupled by the drift region (11). An external signal applied to the detector diode (13) forward biases the detector diode (13) when the drift region (11) potential is below a predetermined voltage and the detector diode (13) becomes reverse biased when the drift region (11) potential is greater than the predetermined voltage.

13 Claims, 1 Drawing Sheet

HIGH POWER SEMICONDUCTOR DEVICE WITH INTEGRAL ON-STATE VOLTAGE DETECTION STRUCTURE

BACKGROUND OF THE INVENTION

The present invention relates, in general, to semiconductor switches, and more particularly, to semiconductor switches with integral on-state voltage detection capability.

Power transistors, including MOSFETs, bipolar transistors, and insulated gate bipolar transistors (IGBTs) are well known devices for switching high power loads. High power switches have two current carrying electrodes and a control electrode and are characteristically able to control high current, high voltage, or both. Because power switches are exposed to high currents and voltages, there exists a constant danger of overheating resulting in permanent damage to the semiconductor switch.

High power switches must support high voltage when the device is off and support high current when the device is on. When a power switch is off, little current flows between the current carrying electrodes and so large voltages across the current carrying electrodes dissipate little power in the device. When a power switch is on, voltage across the current carrying electrodes is normally quite low, thus large currents flow through the current carrying electrodes with high but manageable power dissipation.

Designers of power control circuits, power control modules, and power semiconductor devices are concerned with protection of power switches. Control circuits using many discrete components or integrated circuits are often used to detect dangerous conditions and turn the power switch off to limit power dissipation. These control circuits monitor device temperature with a temperature sensor located near the power switch, or monitor current through the device. One problem with temperature sensing circuits is they react slowly to a dangerous condition because thermal signals are transmitted much slower than electrical signals. Temperature sensing circuits also require elaborate and expensive packaging and assembly to place a temperature sensor sufficiently close to the power switch.

Current sensing circuits can limit power dissipation effectively, but at a great sacrifice in power switching capability. High currents are usually dangerous only when an excessive on-state voltage simultaneously appears across the current carrying electrodes. Current sensing and limiting circuits do not prevent the semiconductor switch from operating in an excessive on-state voltage condition, but instead prevent high currents which could cause damage only if the device did enter the high on-state voltage region. Current sensing circuits are thus more appropriate for preventing damage to external components which are driven by the power switch than for protecting the power switch itself.

Accordingly, it is desirable to have a high power semiconductor switch which detects an excessive on-state voltage condition, while not limiting the switch's current carrying or voltage switching capability.

SUMMARY OF THE INVENTION

Briefly stated, the present invention is achieved by creating a power switch having a power transistor and an on-state voltage detection diode formed in an upper surface of a semiconductor drift region. The on-state voltage detector diode and the power transistor are electrically coupled by the drift region. An external signal applied to the detector diode forward biases the detector diode when the drift region potential is below a predetermined voltage and the detector diode becomes reverse biased when the drift region potential is greater than the predetermined voltage.

As used herein, the term "on-state voltage" refers to voltage appearing across current carrying electrodes of a power switch when the power switch is turned on or conductive.

BRIEF DESCRIPTION OF THE DRAWINGS

FIG. 1 is a highly simplified and enlarged cross-sectional drawing of a semiconductor switch in accordance with the present invention; and.

DETAILED DESCRIPTION OF THE DRAWINGS

Figure 1:
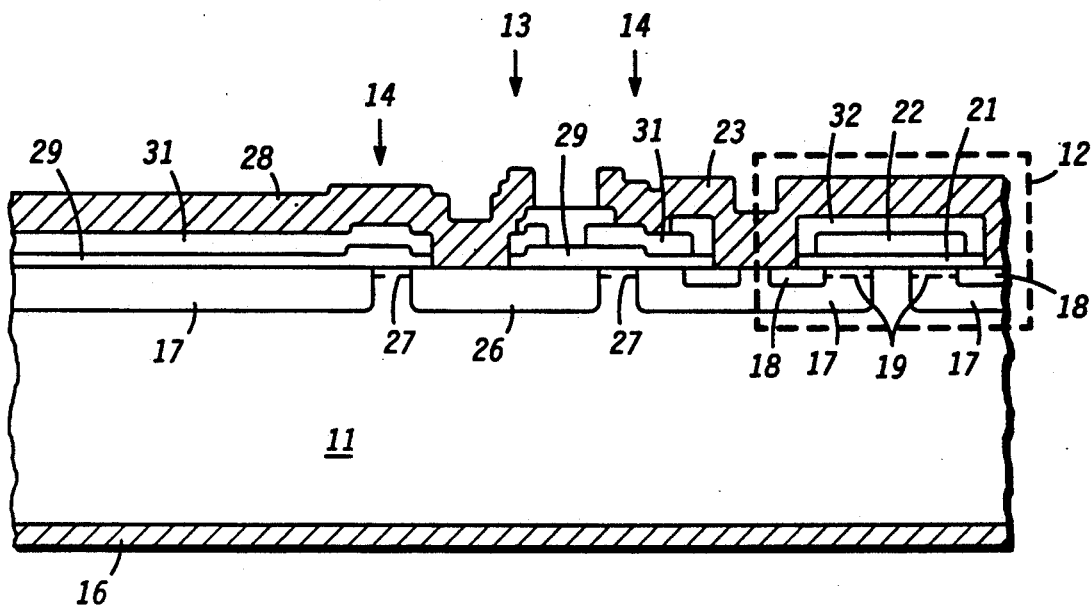

FIG. 1 illustrates a cross-section of one embodiment of the present invention. Although illustrated in terms of a power MOSFET or IGBT structure, it should be understood that the present invention is applicable to power bipolar transistors, junction field effect transistors, and the like. Also, although the preferred embodiments are illustrated as silicon devices, they may be realized in other semiconductor materials, including compound semiconductors such as gallium arsenide. Variations in relative size, shape, and geometry of the particular device features illustrated in the preferred embodiment are possible without altering the spirit of the present invention.

The major elements of the present invention, including power switch 12, detection diode 13, and high voltage FET 14, are formed in an upper surface of a semiconductor drift region 11. Drift region 11 comprises relatively lightly doped semiconductor material and may be a semiconductor substrate or an epitaxial layer on a semiconductor substrate. Drain 16 is a highly conductive region electrically coupled to drift region 11. Drain 16 is typically formed on a lower surface of drift region 11, as illustrated, or may be formed on an upper surface to provide a lateral power device. For ease of description, drain 16 is illustrated as a single layer, but as is well known in the semiconductor art, drain 16 may comprise one or more layers of high conductivity material, including a highly doped semiconductor substrate. Where a semiconductor substrate is used for drain 16, it may be doped n-type, p-type, or have regions of each conductivity type.

Semiconductor switch 12 is illustrated as an insulated gate transistor such as a power MOSFET or IGBT. First gate oxide 21 is formed on the upper surface of drift region 11, usually by thermal oxidation of the upper surface of drift region 11 to a thickness of about 0.03 to 0.15 micrometers. First gate electrode 22 is formed covering gate oxide 21, and comprises a conductive material such as doped polysilicon. First gate electrode 22 and first gate oxide 21 are patterned by photolithography to expose a portion of drift region 11.

A base region 17 is formed by depositing doping atoms in the exposed portions of drift region 11 using first gate electrode 22 as a mask. The doping atoms are thermally redistributed or annealed to provide base region 17 of an opposite conductivity type from drift region 11. A lateral boundary of base region 17 is underneath first gate oxide 21 and first gate electrode 22. Similarly, source regions 18 are formed by depositing doping atoms into base region 17, conveniently using first gate electrode 22 as a mask. The source doping atoms are thermally redistributed or annealed to provide source regions 18 of the same conductivity type as drift region 11. A first channel 19, illustrated by dashed lines, is defined between the lateral boundary of base region 17 and a lateral boundary of source regions 18. Source electrode 23 comprises a conductive material such as aluminum and is electrically coupled to source regions 18. Source electrode 23 is isolated from first gate electrode 22 by dielectric 32 which covers first gate electrode 22.

An on-state voltage detection diode 13, hereinafter referred to as diode 13, is formed in the upper surface of drift region 11 spaced from power switch 12 the detection diode being a diode other than a zener diode. Accordingly, the detection diode 13 is also referred to as a nonzener diode. Diode 13 is formed by a detector region 26 and drift region 11 so that diode 13 is coupled to power switch 12 by drift region 11. Detector region 26 is formed by depositing doping atoms into drift region 11. The doping atoms are thermally redistributed or annealed to provide detector region 26 of an opposite conductivity type from drift region 11. A detector electrode 28 is formed coupled to detector region 26 and electrically isolated from source electrode 23 and first gate electrode 22. It is desirable to form detector region 26 simultaneously with base region 17 to reduce processing steps and cost.

For an N-channel MOSFET switch 12, drift region 11 is n-type conductivity and detector region 26 is p-type conductivity. Diode 13 is forward biased when a detector region 26 is at a higher potential than the potential of the upper surface of drift region 11. Diode 13 is reverse biased when the upper surface of drift region 11 is at a greater potential than detector region 26. Potential of detector region 26 is easily controlled by an external bias applied to detector electrode 28.

In operation, bias is applied to detector electrode 28 so that a few milliamps of forward bias current flow through diode 13 when power switch 12 is on but has acceptably low on-state voltage. When power switch 12 is on and begins to exhibit high on-state voltage, voltage of the upper portion of drift region 11 rises, reverse biasing diode 13 and eliminating current flow through diode 13. This drop in current flow can easily be detected by external circuitry (not shown), and used to shut off power switch 12. When power switch 12 is off, potential of drift region 11 rises, diode 13 is reverse biased, and little current flows through diode 13.

While adequate for low voltage devices, detector region 26 poses difficulties in devices designed to support more than about 100 volts across the current carrying electrodes. Detector region 26 is separated from base region 17 by a second channel 27. When power switch 12 is reverse biased the reverse bias potential across the current carrying electrodes is supported by a PN junction formed between drift region 11 and base region 17. High reverse bias voltages can be supported if, through proper termination, this junction appears to be nearly planar. In other words, any sharp discontinuities in the potential of the upper surface of drift region 11 will degrade voltage blocking capability. Because detector region 26 is not coupled to source electrode 23, it can create a discontinuity which reduces breakdown voltage of high voltage devices.

This problem is solved by addition of high voltage FET 14 which surrounds detector region 26. A second gate oxide 29 is formed covering a channel 27. In a preferred embodiment second gate oxide 29 is in the range of 0.3–0.5 micrometers thick. Second gate electrode 31 is formed on second gate oxide 29 over second channel 27. Second channel 27 is of an opposite conductivity type from first channel 19 described hereinbefore.

Second gate electrode 31 is electrically coupled to source electrode 23 so that an inversion layer forms in second channel 27 as potential of drift region 11 increases. Because second gate oxide 29 is relatively thick, high voltage FET 14 has a threshold voltage in the range of 10–50 volts and second channel 27 only becomes conductive after potential on drift region 11 increases beyond this threshold voltage. Threshold voltage of high voltage FET 14 is preferably greater than about 30 volts and less than about 80 volts. When second channel 27 is conductive, detector region 26 is electrically coupled to base 17. Once coupled to base 17, diode 13 will not interfere with high voltage handling capability of power switch 12.

Figure 2:
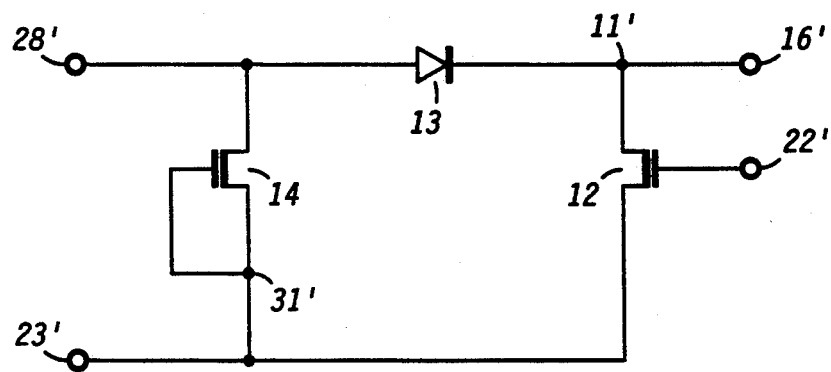
FIG. 2 is a simplified schematic illustrating an equivalent circuit for the embodiment shown in FIG. 1.

FIG. 2 illustrates a simplified equivalent circuit for the embodiment shown in FIG. 1. The elements of FIG. 2 that are the same as FIG. 1 have the same reference numerals. Similarly, nodes of the equivalent circuit which correspond to elements shown in FIG. 1 have the same reference numerals as FIG. 1 but bear a prime designation to aid understanding.

High current flows from drain node 16' through power switch 12 (illustrated as a MOSFET) to source node 23'. Current flow through power switch 12 is controlled by a signal applied at first gate node 22'. Diode 13 is coupled to power switch 12 at node 11'. Node 11' is positioned near power switch 12 to help distinguish between drain electrode 16 and the upper surface of drift region 11, discused hereinbefore in reference to FIG. 1. The other side of diode 13 forms detector bias node 28'. Detector bias node 28' is controllably coupled to source node 23' by high voltage FET 14. Second gate node 31' of high voltage FET 14 is electrically shorted to source node 23.

By now it should be appreciated that a power switch with an integral on-state voltage detector and a method for making and using it is provided. A preferred method of using the on-state voltage detecting semiconductor switch of the present invention involves applying voltage between current carrying nodes 16' and 23' and applying a signal to control node 22' to modulate current through power switch 12. A bias applied to detection bias node 28' forward biases diode 13, when the drain node 16' is below a predetermined voltage. Diode 13 becomes reverse biased when the first current carrying electrode is above the predetermined voltage, resulting in a sharp change in current through diode 13. This sharp change in current is detected at detection bias node 28, and is used by external circuitry to turn power switch 12 off before damage occurs.

We claim:

1. A high power semiconductor device with integral on-state voltage detection structure comprising: a semiconductor drift region of a first conductivity type, having an upper portion and a lower portion; a base region of a second conductivity type formed in the upper portion of the drift region; a source region of the first conductivity type formed in the base region, wherein a first channel is defined between a lateral boundary of the source region and a lateral boundary of the base region; a first gate dielectric covering the first channel; a first gate electrode covering the first gate dielectric over the first channel; a source electrode coupled to the source region and electrically isolated from the first gate electrode; a detector region of the second conductivity type formed in the upper portion of the drift region and separated from the base region by a second channel, wherein the detector region forms a detector diode with the drift region, the detector diode being a diode other than a zener diode; and a detector electrode coupled to the detector region, wherein the detector electrode is electrically isolated from the source electrode and the gate electrode.

2. A high power semiconductor device with integral on-state voltage detection structure comprising:
 a semiconductor drift region of a first conductivity type, having an upper portion and a lower portion;
 a base region of a second conductivity type formed in the upper portion of the drift region;
 a source region of the first conductivity type formed in the base region,, wherein a first channel is defined between a lateral boundary of the source region and a lateral boundary of the base region;
 a first gate oxide covering the first channel;
 a first gate electrode covering the first gate oxide over the first channel;
 a source electrode coupled to the source region and electrically isolated from the first gate electrode;
 a detector region of the second conductivity type formed in the upper portion of the drift region and separate from the base region by a second channel, wherein the detector region forms a detector diode with the drift region, the detector diode being a diode other than a zener diode;
 a second gate oxide covering the second channel;
 a second gate electrode covering the second gate oxide over the second channel, wherein the second channel is of an opposite conductivity type as the first channel; and
 a detector electrode coupled to the detector region, wherein the detector electrode is electrically isolated from the source electrode and the gate electrode.

3. The high power semiconductor device of claim 2 wherein the first gate oxide has a thickness in the range of 0.03–0.15 micrometers and the second gate oxide has a thickness in the range of 0.3–0.5 micrometers.

4. The high power semiconductor device of claim 1 wherein an external signal applied to the detector electrode forward biases the detector diode when the drift region potential is below a predetermined voltage and the detector diode becomes reverse biased when the drift region potential is greater than the predetermined voltage.

5. The high power semiconductor of claim 2 wherein the second gate electrode is electrically coupled to the source electrode so that the second channel becomes conductive when a drift region potential is greater than a predetermined threshold voltage.

6. The high power semiconductor of claim 1 wherein the first conductivity is n-type and the second conductivity is p-type.

7. The high power semiconductor of claim 1 wherein a doping distribution and a junction depth of the base region is substantially the same as doping concentration and junction depth of the detector region.

8. A saturation detecting semiconductor device comprising: a semiconductor drift region of a first conductivity type having an upper surface; a semiconductor switch formed in the upper surface and having a first gate oxide adjacent the upper surface; a nonzener saturation detection diode formed in the upper surface and spaced from the semiconductor switch by at least a channel region, wherein the nonzener saturation detector diode and the semiconductor switch are electrically coupled to the drift region; and a saturation detector electrode coupled to the nonzener saturation detector diode.

9. The saturation detecting semiconductor device of claim 8 further comprising a second gate oxide formed over the channel region; and a gate electrode covering the second gate oxide over the channel region.

10. The saturation detecting semiconductor device of claim 9 wherein thickness of the second gate oxide over the channel region is selected so that the channel region becomes conductive when a potential of the upper surface of the drift region is above a predetermined voltage, wherein the predetermined voltage is greater than about 30 volts and less than a breakdown voltage of the semiconductor switch.

11. The saturation detecting semiconductor device of claim 8 wherein the semiconductor switch comprises a MOSFET transistor.

12. The saturation detecting semiconductor device of claim 8 wherein the semiconductor switch comprises an IGBT.

13. A method for using a saturation detecting semiconductor device comprising the steps: providing a semiconductor switch having a control electrode and first and second current carrying electrodes; providing a detection diode spaced from the semiconductor switch by a channel and electrically coupled to the first current carrying electrode, the detection diode being a diode other than a zener diode; providing a gate electrode controlling conductivity of the channel, wherein the gate electrode is coupled to the second current carrying electrode; applying voltage between the first and second current carrying electrodes; applying a signal to the control electrode; and applying a bias voltage to the detection diode, wherein the bias voltage is selected to forward bias the detection diode when the first current carrying electrode is below a predetermined voltage and to reverse bias the detection diode when the first current carrying electrode is above the predetermined voltage.

* * * * *

UNITED STATES PATENT AND TRADEMARK OFFICE
CERTIFICATE OF CORRECTION

PATENT NO.    : 5,289,028
DATED         : February 22, 1994
INVENTOR(S)   : Lowell Clark et al.

It is certified that error appears in the above-indentified patent and that said Letters Patent is hereby corrected as shown below:

Column 5, claim 2, line 23, delete",", second occurrence.

Column 5, claim 2, line 33, change "separate" to --separated--.

Column 6, claim 8, line 19, change "to" to --by--.

Signed and Sealed this

Thirtieth Day of August, 1994

Attest:

BRUCE LEHMAN

Attesting Officer        Commissioner of Patents and Trademarks